United States Patent
Wu et al.

(10) Patent No.: US 12,046,912 B2
(45) Date of Patent: Jul. 23, 2024

(54) WIRELESS CHARGER

(71) Applicant: HUAWEI DIGITAL POWER TECHNOLOGIES CO., LTD., Shenzhen (CN)

(72) Inventors: Hao Wu, Xi'an (CN); Quanming Li, Dongguan (CN); Jun Chen, Dongguan (CN); Li He, Dongguan (CN)

(73) Assignee: Huawei Digital Power Technologies Co., Ltd.

(*) Notice: Subject to any disclaimer, the term of this patent is extended or adjusted under 35 U.S.C. 154(b) by 199 days.

(21) Appl. No.: 17/947,688

(22) Filed: Sep. 19, 2022

(65) Prior Publication Data
US 2023/0014262 A1    Jan. 19, 2023

Related U.S. Application Data

(63) Continuation of application No. PCT/CN2021/076941, filed on Feb. 19, 2021.

(30) Foreign Application Priority Data

Mar. 19, 2020   (CN) .......................... 202020360385.3

(51) Int. Cl.
  *H02J 50/00*   (2016.01)
  *H02J 50/10*   (2016.01)
  *H05K 7/20*    (2006.01)

(52) U.S. Cl.
  CPC ............ *H02J 50/005* (2020.01); *H02J 50/10* (2016.02); *H05K 7/20145* (2013.01)

(58) Field of Classification Search
  CPC .......... H02J 50/005; H02J 50/10; H02J 50/70; H02J 7/0042–0044; H05K 7/2039;
  (Continued)

(56) References Cited

U.S. PATENT DOCUMENTS

| | | | |
|---|---|---|---|
| 2014/0007594 A1* | 1/2014 | Lofy ................ | H05K 7/20209 62/3.2 |
| 2017/0063130 A1 | 3/2017 | Sultenfuss et al. | |

(Continued)

FOREIGN PATENT DOCUMENTS

| | | |
|---|---|---|
| CN | 204144989 U | 2/2015 |
| CN | 107852009 A | 3/2018 |

(Continued)

OTHER PUBLICATIONS

Extended European Search Report in European Appln No. 21770736.3, dated Jul. 21, 2023, 7 pages.

(Continued)

*Primary Examiner* — Amir A Jalali
(74) *Attorney, Agent, or Firm* — Fish & Richardson P.C.

(57) ABSTRACT

Embodiments of this application provide a wireless charger, and relate to the field of charging device technologies. The wireless charger includes a wireless charging module, a first fan, a housing including a contact plate used for contact with the rear surface of the terminal device, and an air intake vent disposed at a position that is of the housing and that is close to the first fan, and an airflow guide structure disposed on a side that is of the housing and that is adjacent to the contact plate. The airflow guide structure extends toward the display surface of the terminal device.

10 Claims, 11 Drawing Sheets

(58) Field of Classification Search
CPC .......... H05K 7/20136; H05K 7/20145; H05K 7/20172; H05K 5/0213; F28F 3/12; G06F 1/203; H01F 27/085
See application file for complete search history.

(56) References Cited

U.S. PATENT DOCUMENTS

| | | | |
|---|---|---|---|
| 2019/0052104 A1* | 2/2019 | Schlachte | H02J 7/0044 |
| 2021/0185852 A1* | 6/2021 | Yang | H05K 7/2039 |
| 2021/0218256 A1* | 7/2021 | Yang | H01F 38/14 |
| 2022/0217866 A1* | 7/2022 | Wu | H05K 7/20145 |
| 2022/0256732 A1* | 8/2022 | Wu | H02J 7/0044 |

FOREIGN PATENT DOCUMENTS

| | | |
|---|---|---|
| CN | 207725322 U | 8/2018 |
| CN | 207765996 U | 8/2018 |
| CN | 109088463 A | 12/2018 |
| CN | 208674929 U | 3/2019 |
| CN | 208862617 U | 5/2019 |
| CN | 209217759 U | 8/2019 |
| CN | 209233498 U | 8/2019 |
| CN | 209913516 U | 1/2020 |
| CN | 211744148 U | 10/2020 |
| CN | 212543377 U | 2/2021 |

OTHER PUBLICATIONS

International Search Report and Written Opinion in International Appln. No. PCT/CN2021/076941, mailed on Apr. 27, 2021, 20 pages (with English translation).

* cited by examiner

WIRELESS CHARGER

CROSS-REFERENCE TO RELATED APPLICATIONS

This application is a continuation of International Application No. PCT/CN2021/076941, filed on Feb. 19, 2021, which claims priority to Chinese Patent Application No. 202020360385.3, filed on Mar. 19, 2020. The disclosures of the aforementioned applications are hereby incorporated by reference in their entireties.

TECHNICAL FIELD

This application relates to the field of charging device technologies, and in particular, to a wireless charger.

BACKGROUND

When charging a terminal device, a wireless charger transmits electric energy by using a magnetic field generated between coils, to avoid using a charging power cable. Therefore, it is quite convenient to use the wireless charger.

In the process of charging the terminal device (for example, a mobile phone), both the wireless charger and the terminal device generate heat. If the generated heat is not dissipated in a timely manner, charging power and a charging speed are directly affected. Therefore, a heat dissipation problem of the wireless charger and a heat dissipation problem of the terminal device in the charging process are currently thorny problems.

In the conventional technology, a fan is disposed in the wireless charger, heat in the wireless charger is dissipated by using the fan, and an air duct is disposed on a contact plate that is of the wireless charger and that is in contact with a rear surface of the terminal device, and heat of the rear surface of the terminal device is dissipated by using an airflow flowing in the air duct. However, heat of a display surface of the terminal device is naturally dissipated. Consequently, heat dissipation efficiency of the entire terminal device is limited, and the charging power and the charging speed of the terminal device are further limited.

SUMMARY

Embodiments of this application provide a wireless charger, which is mainly intended to resolve a technical problem that a display surface of a terminal device has a poor heat dissipation effect in the conventional technology.

To achieve the foregoing objective, the following technical solutions are used in embodiments of this application.

This application provides a wireless charger. The wireless charger is configured to charge a terminal device, the terminal device includes a display surface and a rear surface that are opposite to each other, and the wireless charger includes:
  a housing, including a contact plate used for contact with the rear surface of the terminal device;
  a wireless charging module;
  a first fan, capable of dissipating heat of the wireless charging module, where both the wireless charging module and the first fan are disposed in the housing, and an air intake vent is disposed at a position that is of the housing and that is close to the first fan; and
  an airflow guide structure, disposed on a side that is of the housing and that is adjacent to the contact plate, where the airflow guide structure extends toward the display surface of the terminal device, the airflow guide structure includes a flow channel, a first air exhaust vent connected to the flow channel is disposed at a position that is of the airflow guide structure and that is close to the display surface of the terminal device, an air vent connected to space in which the first fan is located is disposed at a position that is of the housing and at which the airflow guide structure is disposed, and the air vent is connected to the flow channel.

According to the wireless charger provided in embodiments of this application, because the airflow guide structure is disposed on the side that is of the housing and that is adjacent to the contact plate, when the first fan works, an airflow flowing around the first fan passes through the air vent and flows to the flow channel of the airflow guide structure, and blows toward the display surface of the terminal device through the first air exhaust vent to dissipate heat of the display surface of the terminal device. Therefore, a heat dissipation effect on the display surface is significantly improved in comparison with an existing natural dissipation manner of the display surface. In addition, because the rear surface of the terminal device is in contact with the contact plate of the housing, a relatively cold airflow in the housing is conducted to the contact plate under the action of the first fan to dissipate heat of the rear surface of the terminal device. Therefore, in comparison with the conventional technology, the wireless charger provided in embodiments of this application can dissipate the heat of the rear surface of the terminal device and the heat of the display surface of the terminal device, so that a heat dissipation effect on the entire terminal device is effectively improved, and therefore charging power and a charging speed of the terminal device are increased accordingly. In addition, because the first fan is disposed in the housing, heat of the wireless charging module located in the housing is also dissipated, so that a heat dissipation effect on the wireless charging module is ensured.

In a possible implementation, an air duct is formed on a side that is of the contact plate and that faces the rear surface of the terminal device, the air duct extends to the edge of the contact plate, a second air exhaust vent connected to the flow channel is disposed at a position that is of the airflow guide structure and that is close to the rear surface of the terminal device, and the second air exhaust vent is connected to the air duct. The air duct is disposed on the side that is of the contact plate and that faces the rear surface of the terminal device, the second air exhaust vent connected to the flow channel is disposed at the position that is of the airflow guide structure and that is close to the rear surface of the terminal device, and the second air exhaust vent is connected to the air duct, so that the airflow flowing around the first fan passes through the air vent and flows to the flow channel of the airflow guide structure, and then passes through the second air exhaust vent and flows to the air duct, to dissipate the heat emitted by the rear surface of the terminal device. In addition, because the air duct extends to the edge of the contact plate, an airflow obtained after the heat exchange in the air duct flows out of the contact plate to rapidly exhaust heat. Therefore, the wireless charger provided in embodiments of this application can further improve a heat dissipation effect on the rear surface of the terminal device.

In a possible implementation, the contact plate includes a metal part and a plastic part, and the wireless charging module is disposed at a position that is in the housing and that is opposite to the plastic part. Because the plastic part is disposed at a position that is of the contact plate and that is opposite to the wireless charging module, in comparison with a case in which the metal part is disposed at the position that is of the contact plate and that is opposite to the wireless charging module, the plastic part can ensure that the wireless charging module and the terminal device transmit electric energy by using an alternating magnetic field generated between coils, so that the terminal device is wirelessly charged. In addition, the contact plate further includes the metal part. The metal part has a higher thermal conductivity than the plastic part, so that the heat generated by the rear surface of the terminal device can be dissipated as soon as possible by using the metal part, thereby further improving a heat dissipation effect on the rear surface of the terminal device.

In a possible implementation, a plurality of protrusions arranged in parallel exist on a side that is of the metal part and that faces the terminal device, an air duct is formed between two adjacent protrusions, a spacing exists between a side that is of the plastic part and that faces the terminal device and the rear surface of the terminal device, to form an air duct, and the air duct formed on the metal part is connected to the air duct formed on the plastic part. A plurality of protrusions arranged in parallel are disposed, so that an air duct is formed between two adjacent protrusions, and an airflow in the air duct dissipates the heat of the rear surface of the terminal device.

In addition, because the wireless charging module is disposed at the position that is in the housing and that is opposite to the plastic part, a relatively large amount of heat is conducted from the wireless charging module to the plastic part. The spacing exists between the side that is of the plastic part and that faces the terminal device and the rear surface of the terminal device, so that the air duct has a relatively large dissipation area and can rapidly dissipate heat on the plastic part.

To ensure wireless charging, a coil in the terminal device is disposed opposite to the wireless charging module. In this way, a relatively large amount of heat is also conducted from the coil in the terminal device to a first position on the rear surface of the terminal device. The spacing exists between the side that is of the plastic part and that faces the terminal device and the rear surface of the terminal device, so that the air duct has a relatively large dissipation area and can rapidly dissipate heat on the first position on the rear surface of the terminal device. The first position is a position that is of the terminal device and that is opposite to the plastic part.

In a possible implementation, the wireless charger further includes an auxiliary heat dissipation structure, and the auxiliary heat dissipation structure is disposed at a position that is in the housing and that is close to the contact plate. The auxiliary heat dissipation structure is disposed to further improve a heat dissipation effect on the terminal device.

In a possible implementation, the auxiliary heat dissipation structure includes a refrigeration unit, the refrigeration unit includes a cold-end substrate and a hot-end substrate that are disposed opposite to each other, a plurality of semiconductor thermocouple pairs arranged in parallel exist between the cold-end substrate and the hot-end substrate, and both ends of the semiconductor thermocouple pair are disposed on the corresponding cold-end substrate and hot-end substrate by using conductive electrodes. The cold-end substrate abuts against the contact plate, and the hot-end substrate is away from the contact plate. The cold-end substrate abuts against the contact plate to absorb heat on the contact plate, and the contact plate is refrigerated by using the refrigeration unit performing thermoelectric refrigeration. The refrigeration unit has a simple structure and relatively low power consumption, and is capable of continuously working. The refrigeration unit can reach a maximum temperature difference several seconds after a current is applied. In addition, when the refrigeration unit works, no vibration occurs, and no noise is generated. Therefore, performance of the wireless charger is improved, and user experience is enhanced.

In a possible implementation, the auxiliary heat dissipation structure includes a second fan. The second fan is used to facilitate flowing of a peripheral airflow for heat dissipation.

In a possible implementation, the housing includes a base and an installation part connected to an end of the base, the installation part is tilted relative to the base to form a vertical structure, the wireless charging module is located in the installation part, the contact plate is formed on the installation part and is located on a side away from the base, the air vent is disposed at a position that is of the installation part and that is connected to the base, and the airflow guide structure and the base are disposed opposite to each other on both sides of the installation part. Because the housing includes the base and the installation part that are tilted relative to each other to form a vertical structure, and the airflow guide structure is disposed at the position that is of the installation part and that is connected to the base, the airflow guide structure can guide an airflow to enable the airflow to blow toward the display surface of the terminal device and also support the terminal device, so that the terminal device can be stably placed on the installation part.

In a possible implementation, airflow guide structures are disposed on both opposite sides of the installation part. Because the airflow guide structures are disposed on both opposite sides of the installation part, and cooperate with the airflow guide structure disposed at the position that is of the installation part and that is connected to the base, a heat dissipation effect on the display surface of the terminal device is further improved.

In a possible implementation, the first fan is disposed in the base. In comparison with a case in which both the wireless charging module and the first fan are disposed in the installation part in a thickness direction of the installation part, in the case in which the first fan is disposed in the base, a thickness and a size of the installation part can be reduced accordingly. In addition, the airflow guide structure located at the position that is of the installation part and that is connected to the base is close to the first fan, so that the airflow around the first fan rapidly flows through the flow channel and blows toward the display surface of the terminal device from the first air exhaust vent, thereby further improving a heat dissipation effect on the display surface of the terminal device.

In a possible implementation, the housing is of a flat plate structure, the wireless charging module and the first fan are vertically stacked in a thickness direction of the housing, the wireless charging module is close to the contact plate, the air intake vent is disposed on a first side of the housing, the air vent is disposed on a second side of the housing, and the first side and the second side are opposite to each other. Because the air intake vent and the air exhaust vent are disposed on opposite sides, a flowing resistance of an airflow can be reduced, and heat of the terminal device can be rapidly dissipated.

BRIEF DESCRIPTION OF DRAWINGS

FIG. 1b is a top view of the wireless charger in FIG. 1a;

FIG. 1c is a sectional view of FIG. 1a;

FIG. 2b is a top view of the wireless charger in FIG. 2a;

FIG. 2c is a sectional view of FIG. 2a;

FIG. 3b is a top view of the wireless charger in FIG. 3a;

FIG. 3c is a sectional view of FIG. 3a;

FIG. 4b is a top view of the wireless charger in FIG. 4a;

FIG. 4c is a sectional view of FIG. 4a;

REFERENCE NUMERALS

1—Housing; 101—Contact plate; 101A—Plastic part; 101B—Metal part; 102—Air intake vent; 103—Air vent; 104—Heat exhaust vent; 11—Base; 12—Installation part; 2—Wireless charging module; 201—Charging coil; 202—Electromagnetic plate; 203—Support pad; 3—First fan; 4—Airflow guide structure; 401—Flow channel; 402—First air exhaust vent; 403—Second air exhaust vent; 501—Protrusion; 502—Air duct; 61—Refrigeration unit; 611—Cold-end substrate; 612—Hot-end substrate; 613—N-type semiconductor; 614—P-type semiconductor; 615—First conductive electrode; 616—Second conductive electrode; 62—Second fan; 7—Thermally conductive block; 8—Terminal device; 801—Display surface; 802—Rear surface.

DESCRIPTION OF EMBODIMENTS

Embodiments of this application relate to a wireless charger. The following describes the wireless charger in detail with reference to the accompanying drawings.

Figure 1A:
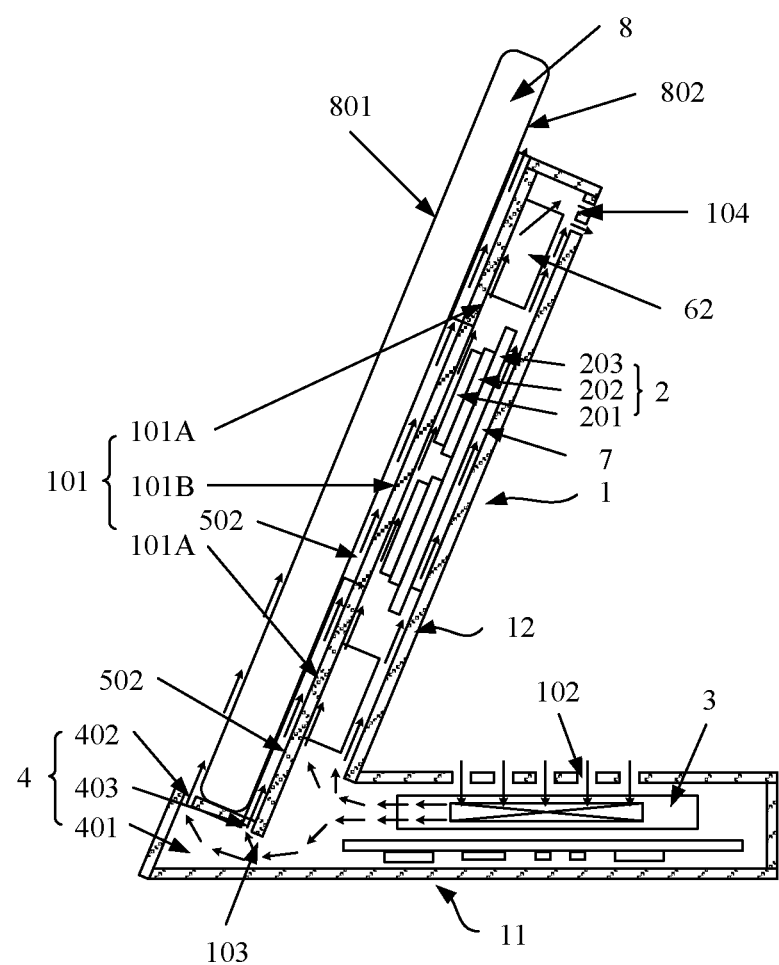
FIG. 1a is a schematic diagram of an installation relationship between a wireless charger and a terminal device according to an embodiment of this application.

The wireless charger provided in embodiments of this application is configured to charge a terminal device. For example, the wireless charger is used to wirelessly charge an electronic device such as a mobile phone, a tablet computer, or a player. As shown in FIG. 1a, a terminal device 8 includes a display surface 801 and a rear surface 802 that are opposite to each other. Generally, a charging module in the terminal device is close to the rear surface. When the terminal device is specifically charged, the rear surface of the terminal device is in contact with a wireless charger to perform wireless charging.

Referring to FIG. 1a, the wireless charger provided in embodiments of this application includes a housing 1, a wireless charging module 2, a first fan 3, and an airflow guide structure 4. The housing 1 includes a contact plate 101 used for contact with the rear surface 802 of the terminal device 8, both the wireless charging module 2 and the first fan 3 are disposed in the housing 1, the first fan 3 can dissipate heat of the wireless charging module 2, and an air intake vent 102 is disposed at a position that is of the housing 1 and that is close to the first fan 3. The airflow guide structure 4 is disposed on a side that is of the housing 1 and that is adjacent to the contact plate 101, the airflow guide structure 4 extends toward the display surface 801 of the terminal device 8, the airflow guide structure 4 includes a flow channel 401, a first air exhaust vent 402 connected to the flow channel 401 is disposed at a position that is of the airflow guide structure 4 and that is close to the display surface 801 of the terminal device 8, an air vent 103 connected to space in which the first fan 3 is located is disposed at a position that is of the housing 1 and at which the airflow guide structure 4 is disposed, and the air vent 103 is connected to the flow channel 401.

The wireless charger provided in embodiments of this application can wirelessly charge the terminal device and dissipate heat of the terminal device.

After the rear surface of the terminal device 8 abuts against the contact plate 101 of the housing 1, a specific process in which the wireless charger dissipates the heat of the terminal device is as follows: When the first fan 3 runs, because the airflow guide structure 4 extends toward the display surface 801 of the terminal device 8, and the first air exhaust vent 402 connected to the flow channel is disposed at the position that is of the airflow guide structure 4 and that is close to the display surface 801 of the terminal device 8, an airflow flowing around the first fan 3 passes through the air vent 103 and flows to the flow channel 401 of the airflow guide structure 4, and then the airflow in the flow channel 401 blows toward the display surface 801 of the terminal device 8 through the first air exhaust vent 402 to dissipate heat of the display surface 801 of the terminal device 8, in other words, the heat of the display surface of the terminal device is dissipated through blowing. Therefore, a heat dissipation effect on the display surface is significantly improved in comparison with a natural dissipation manner. In addition, an airflow flowing around the first fan 3 also flows to the wireless charging module 2 to dissipate the heat emitted by the wireless charging module 2. In addition, because the rear surface of the terminal device 8 is in contact with the contact plate 101 of the housing 1, heat emitted by the rear surface of the terminal device 8 is also dissipated through thermal conduction under the action of the first fan, so that the heat of the rear surface of the terminal device 8 is dissipated.

Therefore, the wireless charger provided in embodiments of this application can dissipate the heat of the wireless charging module, the heat of the rear surface of the terminal device, and the heat of the display surface of the terminal device. In comparison with the conventional technology, in a same charging power condition, a heat dissipation capability of the terminal device is improved by at least 20%, so that user experience is enhanced.

During specific implementation, an airflow guide plate with a hollow structure is installed at the air vent of the housing 1, space in the airflow guide plate forms the flow channel, the first air exhaust vent is disposed at a position that is of the airflow guide plate and that is close to the display surface of the terminal device, and the airflow guide plate with the hollow structure and the first air exhaust vent forms the airflow guide structure.

A material of the airflow guide structure has a plurality of implementations. In some implementations, the material of the airflow guide structure is plastic. In other implementations, the material of the airflow guide structure is metal. To improve a heat dissipation effect, the material of the airflow guide structure is metal. The metal has a higher thermal conductivity than the plastic. In other words, using an airflow guide structure of the metal material further improves the heat dissipation effect.

Figure 2A:
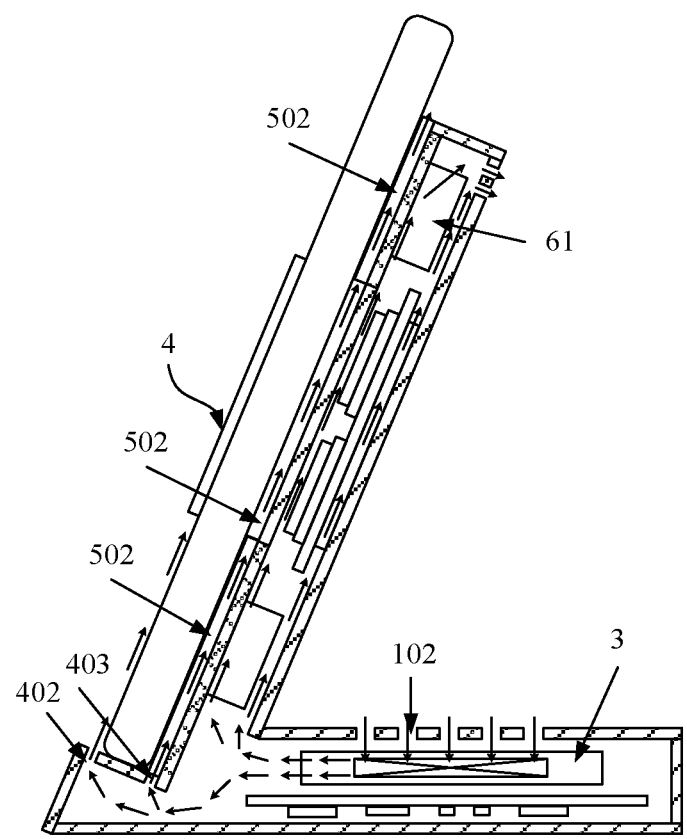
FIG. 2a is a schematic diagram of an installation relationship between a wireless charger and a terminal device according to an embodiment of this application.
Figure 2B:
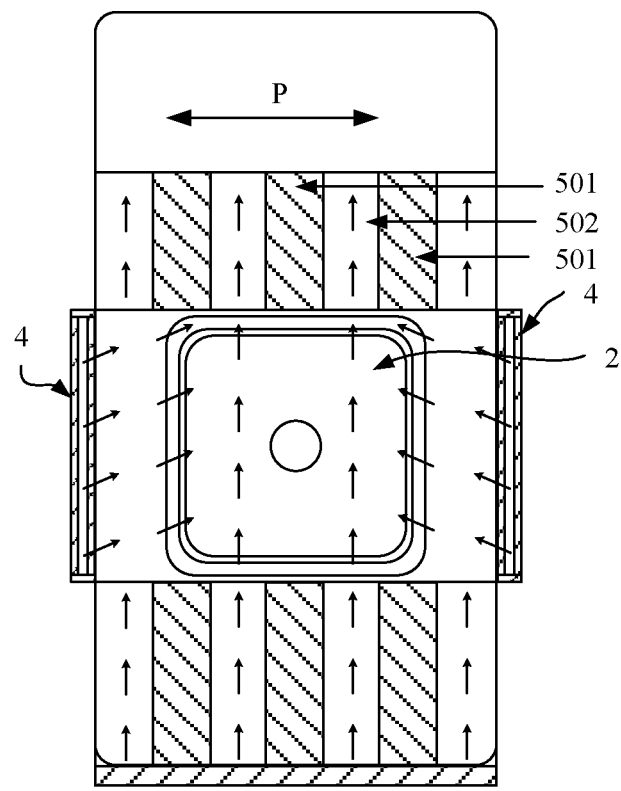
Figure 2C:
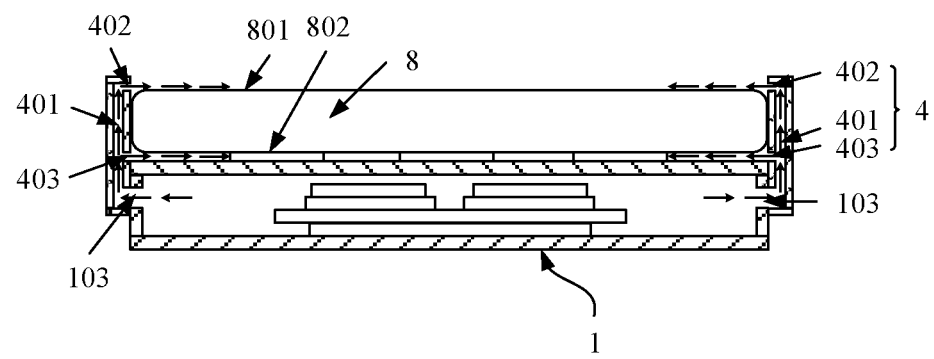
Figure 3A:
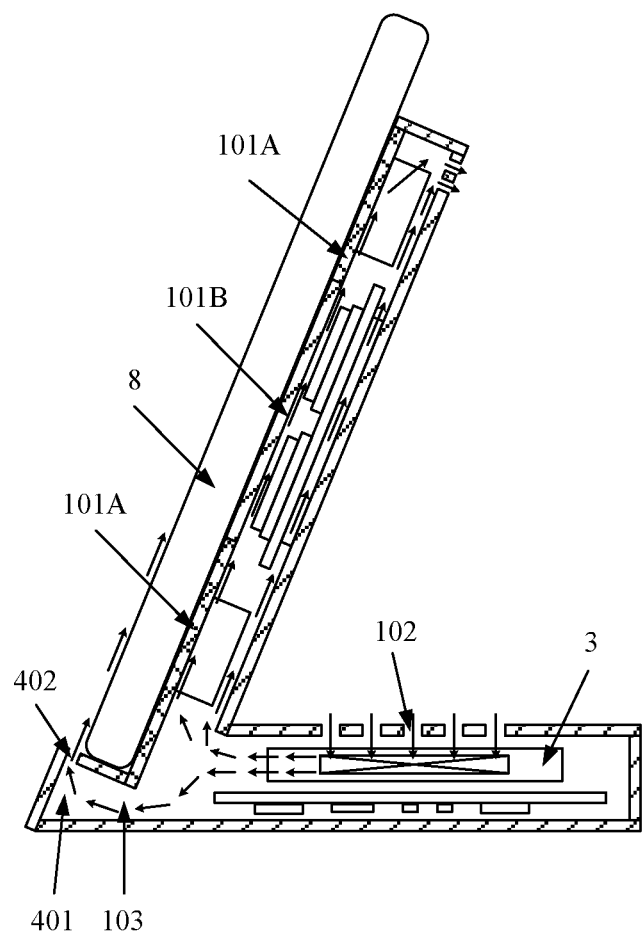
FIG. 3a is a schematic diagram of an installation relationship between a wireless charger and a terminal device according to an embodiment of this application.
Figure 3B:
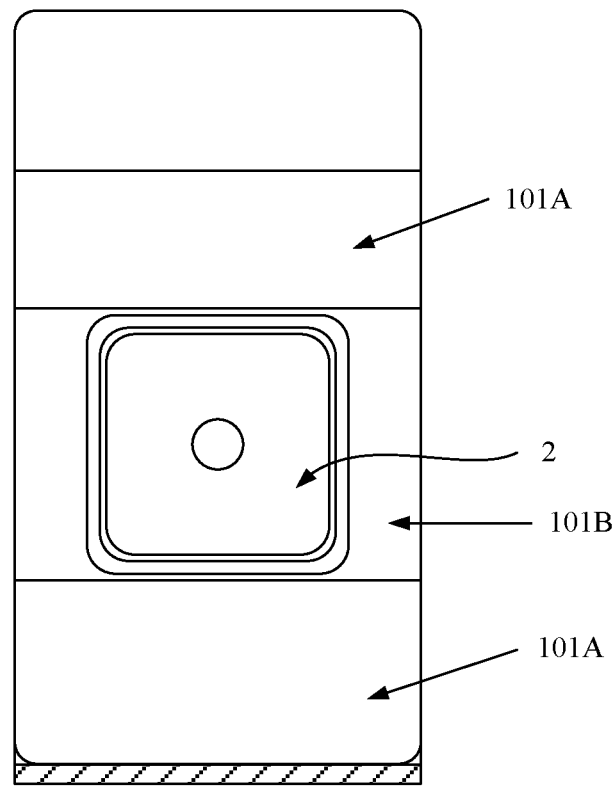
Figure 3C:
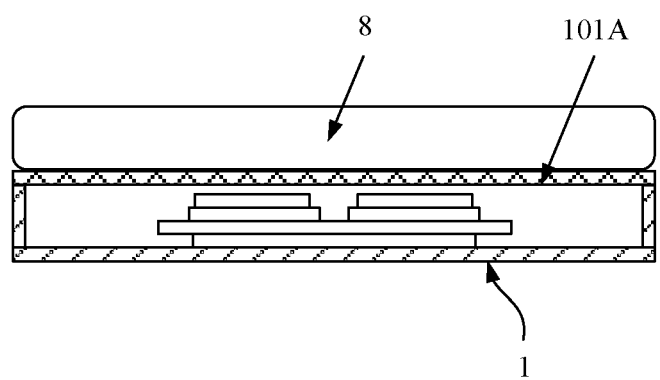
Figure 4A:
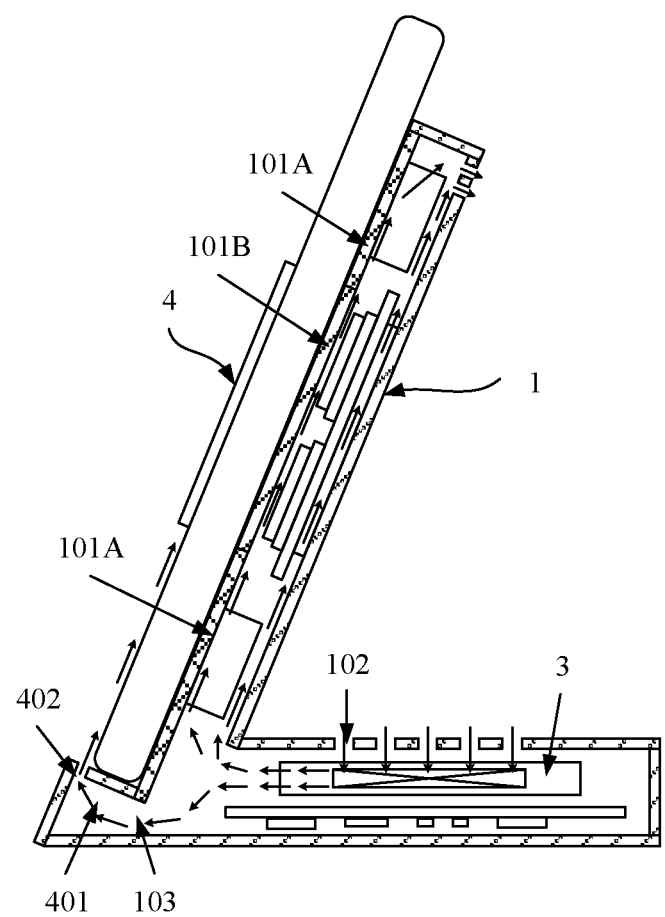
FIG. 4a is a schematic diagram of an installation relationship between a wireless charger and a terminal device according to an embodiment of this application.
Figure 4B:
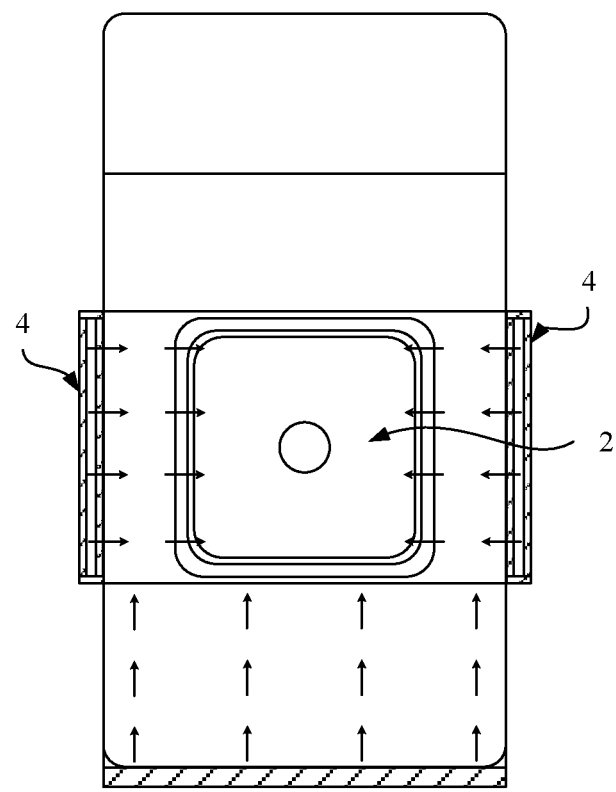
Figure 4C:
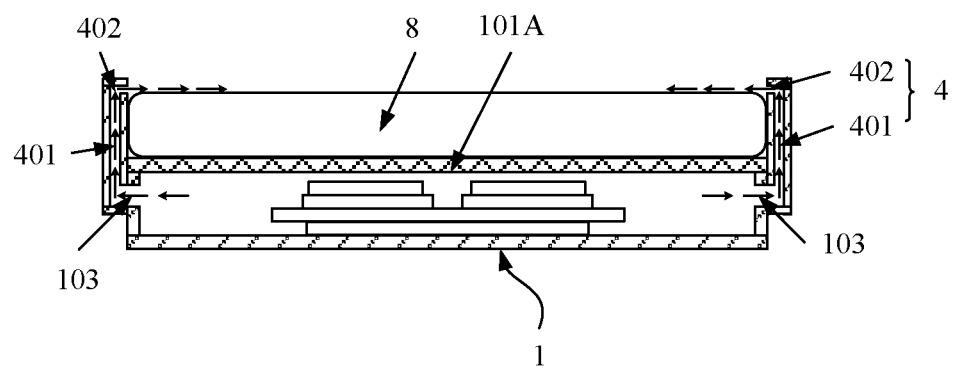
Figure 5:
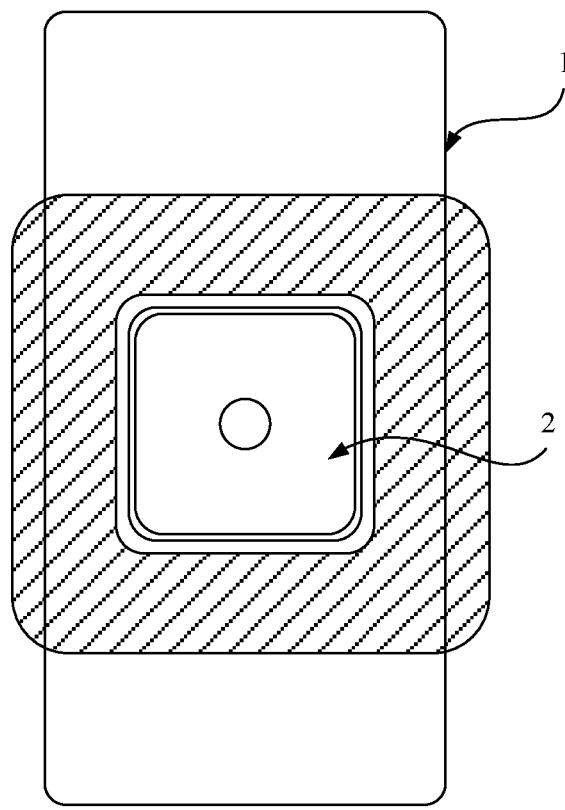
FIG. 5 is a schematic diagram of a structure of a wireless charger according to an embodiment of this application.

There are a plurality of cases for a position at which the airflow guide structure 4 is disposed on the housing 1. For example, the airflow guide structure 4 is disposed on a bottom surface that is of the housing 1 and that is adjacent to the contact plate 101, as shown in FIG. 1*a*. For another example, the airflow guide structure 4 is disposed on a top surface that is of the housing 1 and that is adjacent to the contact plate 101. For still another example, the airflow guide structure 4 is disposed on a side that is of the housing 1 and that is adjacent to the contact plate 101, as shown in FIG. 2*b*.

There are usually the following two embodiments for a structure of the housing 1 of the wireless charger.

Embodiment 1: Referring to FIG. 1*a*, FIG. 2*a*, FIG. 3*a*, and FIG. 4*a*, the housing 1 includes a base 11 and an installation part 12 connected to an end of the base 11, the installation part 12 is tilted relative to the base 11 to form a vertical structure, the wireless charging module 2 is located in the installation part 12, the contact plate 101 is formed on the installation part 12 and is located on a side away from the base 11, the air vent 103 is disposed at a position that is of the installation part 12 and that is connected to the base 11, and the airflow guide structure 4 and the base 11 are disposed opposite to each other on both sides of the installation part 12.

Because the base 11 and the installation part 12 are tilted relative to each other to form a vertical structure, and the airflow guide structure 4 is disposed at the position that is of the installation part 12 and that is connected to the base 11, the tilted terminal device 8 is blocked by the airflow guide structure 4 after the rear surface of the terminal device 8 abuts against the contact plate 101, so that the terminal device 8 is prevented from moving downward. Therefore, disposing the airflow guide structure 4 at the position that is of the installation part 12 and that is connected to the base 11 can guide an airflow to the display surface of the terminal device 8 and also support the terminal device. One structure implements two functions, and performance of the wireless charger is improved without making the structure complex.

To further rapidly dissipate heat in the housing, a heat exhaust vent such as a heat exhaust vent 104 in FIG. 1*a* may be disposed at another position of the housing.

Embodiment 2: Referring to FIG. 5 and FIG. 6*a* to FIG. 6*d*, the housing 1 is of a flat plate structure, the wireless charging module 2 and the first fan 3 are vertically stacked in a thickness direction of the housing 1, the wireless charging module 2 is close to the contact plate 101, the air intake vent 102 is disposed on a first side of the housing 1, the air vent 103 is disposed on a second side of the housing 1, and the first side and the second side are opposite to each other.

In other words, when the housing 1 is of a flat plate structure, the air intake vent 102 and the air vent 103 are disposed opposite to each other. This achieves the following technical effects: Under the action of the first fan 3, an airflow passing through the air intake vent 102 rapidly passes through the air vent 103 and enters the flow channel 401 of the airflow guide structure 4, and finally blows toward the display surface 801 of the terminal device 8 through the first air exhaust vent 402. In addition, because the wireless charging module 2 and the first fan 3 are vertically stacked, the first fan 3 also rapidly dissipates the heat of the wireless charging module.

When the structure of the housing 1 is the structure described in Embodiment 1, referring to FIG. 2*a* to FIG. 2*c* and FIG. 4*a* to FIG. 4*c*, airflow guide structures 4 are disposed on both opposite sides of the installation part 12. Because the airflow guide structures are disposed on both opposite sides of the installation part 12, and the airflow guide structure 4 is disposed at the position that is of the installation part 12 and that is connected to the base 11, a heat dissipation effect on the display surface of the terminal device is significantly improved.

In addition, the airflow guide structures 4 are disposed on both opposite sides of the installation part 12. Referring to FIG. 2*b*, the airflow guide structure at this position can also have a limiting function, to prevent the terminal device in contact with the contact plate 101 from moving in a direction P, thereby ensuring a charging effect.

There are a plurality of cases for a position of the airflow guide structure 4 disposed on the side of the installation part 12. For example, the airflow guide structure 4 may be close to the middle of the installation part 12. For another example, the airflow guide structure 4 is close to the top of the installation part 12. The position at which the airflow guide structure 4 is disposed on the installation part 12 is not limited herein, and any structure falls within the protection scope of this application.

When the structure of the housing 1 is the structure described in Embodiment 1, referring to FIG. 1*a*, the first fan 3 may be disposed in the base 11. The following technical effects can be achieved when the first fan 3 is disposed in the base 11: In comparison with a case in which both the first fan 3 and the wireless charging module 2 are disposed in the installation part 12, a size of the installation part 12 can be reduced, and space in the base 11 can be fully used. In particular, the airflow guide structure located at the position that is of the installation part 12 and that is connected to the base 11 is close to the first fan, so that the airflow around the first fan rapidly flows through the flow channel and blows toward the display surface of the terminal device from the first air exhaust vent, thereby further improving a heat dissipation effect on the display surface of the terminal device.

To improve a heat dissipation effect on the rear surface 802 of the terminal device 8, referring to FIG. 1*a* to FIG. 1*c* and FIG. 2*a* to FIG. 2*c*, an air duct 502 exists on a side that is of the contact plate 101 and that faces the rear surface 802 of the terminal device 8, the air duct 502 extends to the edge of the contact plate 101, a second air exhaust vent 403 connected to the flow channel is disposed at a position that is of the airflow guide structure 4 and that is close to the rear surface 802 of the terminal device 8, and the second air exhaust vent 403 is connected to the air duct 502.

A specific heat dissipation process of the rear surface 802 of the terminal device 8 is as follows: The airflow flowing around the first fan 3 passes through the air vent 103 and flows to the flow channel 401, and then passes through the second air exhaust vent 403 and enters the air duct 502, to dissipate the heat of the rear surface of the terminal device 8. In addition, because the air duct extends to the edge of the contact plate, an airflow obtained after the heat exchange is exhausted from the air duct, to avoid affecting a heat dissipation effect because the airflow obtained after the heat exchange circulates in the air duct of the contact plate.

Figure 1B:
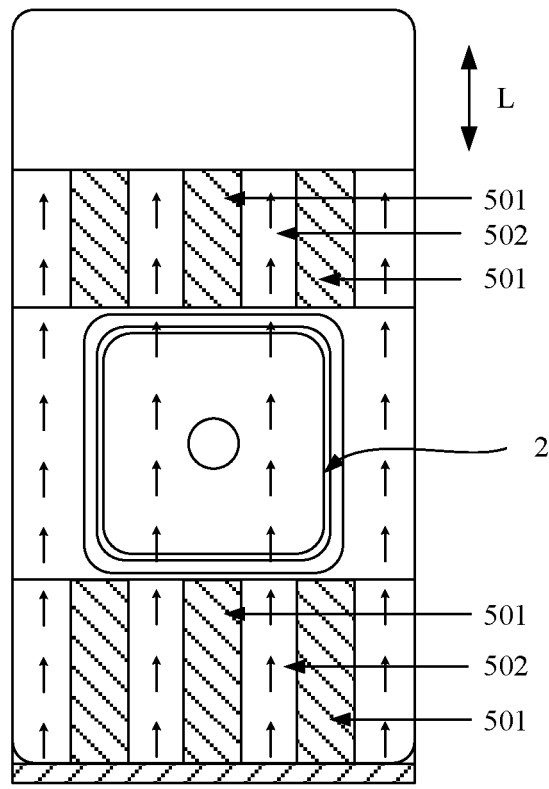
Figure 1C:
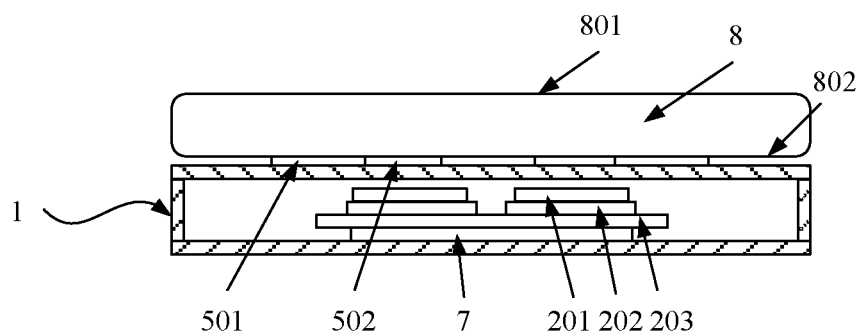

There are a plurality of cases for a structure of the air duct 502. For example, the air duct is a straight air duct, as shown in FIG. 1B. For another example, the air duct is a curved air duct. The structure of the air duct is not limited herein, and an air duct of any structure falls within the protection scope of this application.

To ensure that the wireless charging module 2 in the housing 1 and the terminal device 8 transmit electric energy through electromagnetic induction of a coil, the contact plate 101 is usually made of a plastic material. However, a thermal conductivity of a contact plate 101 made of plastic is relatively low.

To further improve a heat dissipation effect, referring to FIG. 1a, the contact plate 101 includes a metal part 101B and a plastic part 101A, and the wireless charging module 2 is disposed at a position that is in the housing 1 and that is opposite to the plastic part 101A. The plastic part 101A is disposed at a position that is of the contact plate 101 and that is opposite to the wireless charging module 2, to ensure that the wireless charging module and the terminal device transmit electric energy by using an alternating magnetic field generated between coils, so that the terminal device is wirelessly charged. In addition, the contact plate 101 further includes the metal part 101B. The metal part 101B is disposed to improve heat dissipation effects on the wireless charger and the terminal device. Therefore, using the contact plate including the metal part 101B and the plastic part 101A effectively improves the heat dissipation effects on the terminal device and the wireless charger while ensuring wireless charging.

Figure 6A:
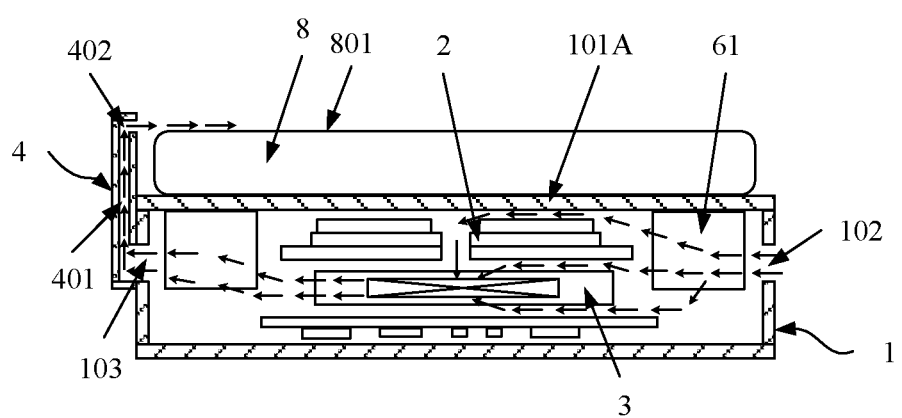
FIG. 6a is a sectional view of a wireless charger and a terminal device according to an embodiment of this application.
Figure 6B:
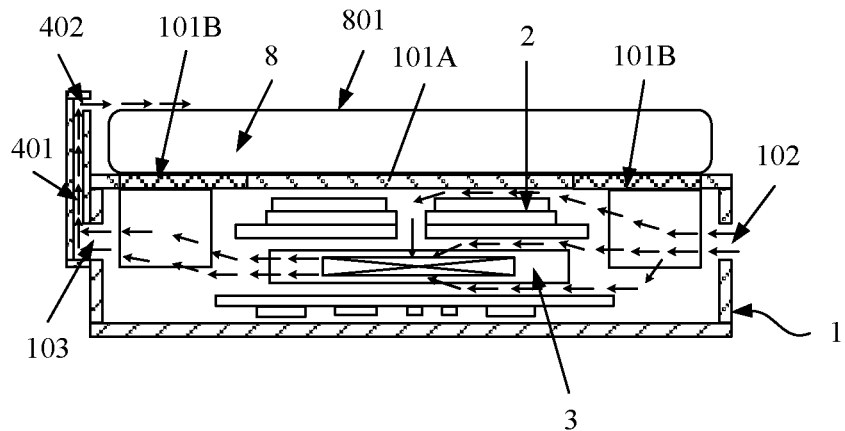
FIG. 6b is a sectional view of a wireless charger and a terminal device according to an embodiment of this application.
Figure 6C:
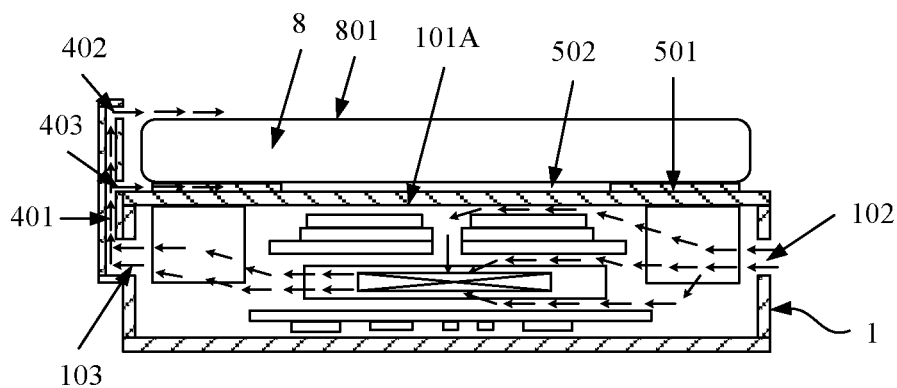
FIG. 6c is a sectional view of a wireless charger and a terminal device according to an embodiment of this application.
Figure 6D:
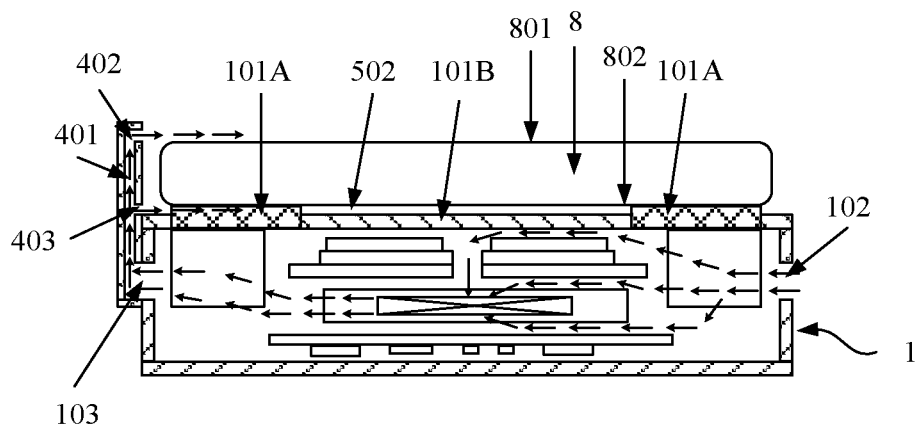
FIG. 6d is a sectional view of a wireless charger and a terminal device according to an embodiment of this application.

If the contact plate 101 is a plastic part, in other words, does not include a metal part, referring to FIG. 6a, no air duct may be disposed on the contact plate that is a plastic part; or referring to FIG. 6c, the air duct 502 may be disposed on the contact plate that is a plastic part, and the air duct 502 is connected to the second air exhaust vent 403 of the airflow guide structure 4. In this way, heat is exchanged between an airflow flowing inside the air duct and both the heat emitted by the wireless charger and the heat emitted by the terminal device. Therefore a heat dissipation effect is significantly improved in comparison with a contact plate on which no air duct is disposed.

If the contact plate 101 includes the metal part 101B and the plastic part 101A, referring to FIG. 3a to FIG. 3c and FIG. 4a to FIG. 4c, no air ducts may be disposed on the metal part 101B and the plastic part 101A, in other words, the rear surface 802 of the terminal device 8 is in contact with the metal part 101B and the plastic part 101A, so that the heat of the terminal device and the heat of the wireless charger are dissipated through thermal conduction.

If the contact plate 101 includes the metal part 101B and the plastic part 101A, air ducts may be disposed on the metal part 101B and the plastic part 101A to dissipate heat. There are a plurality of cases for specific structures of the air ducts. The following uses two embodiments for description.

Embodiment 1: A plurality of protrusions arranged in parallel exist on a side that is of the metal part 101B and that faces the terminal device 8, an air duct is formed between two adjacent protrusions, a plurality of protrusions arranged in parallel exist on a side that is of the plastic part 101A and that faces the terminal device 8, an air duct is also formed between two adjacent protrusions, and the air duct on the metal part 101B is connected to the air duct on the plastic part 101A.

Embodiment 2: Referring to FIG. 1a, FIG. 1B, FIG. 2a, and FIG. 2b, a plurality of protrusions 501 arranged in parallel exist on a side that is of the metal part 101B and that faces the terminal device 8, an air duct 502 is formed between two adjacent protrusions 501, a spacing exists between a side that is of the plastic part 101A and that faces the terminal device 8 and the rear surface of the terminal device, to form an air duct, and the air duct formed on the metal part is connected to the air duct formed on the plastic part.

When the structure in Embodiment 2 is used, the rear surface 802 of the terminal device 8 abuts against the protrusion on the metal part 101B during wireless charging of the terminal device 8, so that a spacing exists between the rear surface of the terminal device 8 and the plastic part 101A, to form an air duct with a relatively large heat dissipation area.

The following technical effects are achieved when the structure shown in FIG. 1a, FIG. 1b, FIG. 2a, and FIG. 2b is used: Because the wireless charging module 2 is disposed opposite to the plastic part 101A, the heat emitted by the wireless charging module 2 is conducted to the plastic part 101A. Because the air duct with a relatively large heat dissipation area is formed at a position of the plastic part 101A, a flow velocity of an airflow is significantly increased, and the heat conducted to the plastic part 101A is dissipated as soon as possible. In addition, because the wireless charging module 2 is disposed opposite to the plastic part 101A, a coil in the terminal device 8 is also disposed opposite to the plastic part. Therefore, a relatively large amount of heat is also conducted to a position that is of the rear surface of the terminal device and that is opposite to the plastic part. Disposing the air duct with a relatively large heat dissipation area effectively increases the flow velocity of the airflow, to improve a dissipation speed of the heat emitted by the terminal device.

When the contact plate 101 includes the metal part 101B and the plastic part 101A, because the wireless charging module 2 is close to the middle of the contact plate 101, the plastic part 101A is located in the middle of the contact plate, and the metal part 101B may be disposed around the plastic part 101A. For example, referring to FIG. 1B, the metal part 101B is located on both sides of the plastic part 101A in a length direction L of the contact plate 101. Specific positions at which the metal part 101B and the plastic part 101A are disposed are not limited in this application.

To further improve a heat dissipation effect of the wireless charger on the terminal device and a heat dissipation effect on the wireless charging module, the wireless charger further includes an auxiliary heat dissipation structure, and the auxiliary heat dissipation structure is disposed at a position that is in the housing and that is close to the contact plate.

The auxiliary heat dissipation structure has a plurality of feasible structures. The following uses three embodiments for description.

Figure 7:
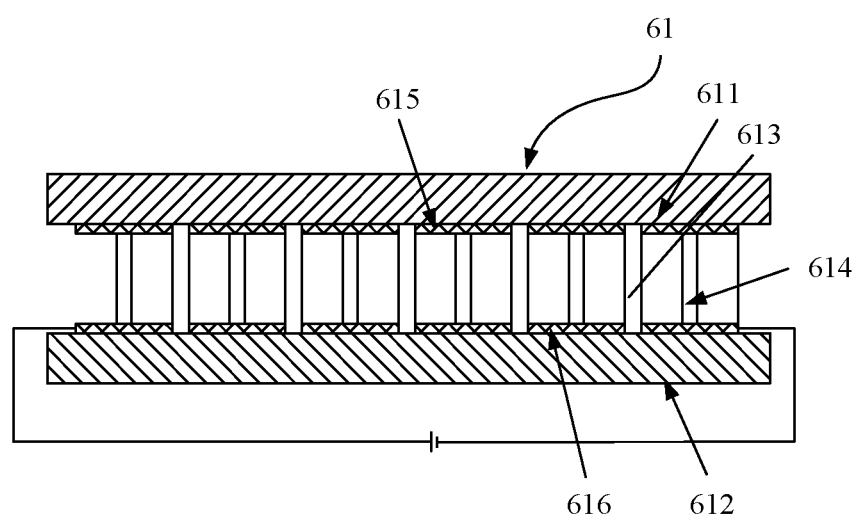
FIG. 7 is a schematic diagram of a structure of a refrigeration unit according to an embodiment of this application.

Embodiment 1: Referring to FIG. 7, the auxiliary heat dissipation structure includes a refrigeration unit 61, the refrigeration unit 61 includes a cold-end substrate 611 and a hot-end substrate 612 that are disposed opposite to each other, a plurality of semiconductor thermocouple pairs (N-type semiconductors 613 and P-type semiconductors 614) arranged in parallel exist between the cold-end substrate 611 and the hot-end substrate 612, and both ends of the semiconductor thermocouple pair are disposed on the corresponding cold-end substrate 611 and hot-end substrate 612 by using conductive electrodes. Specifically, one end of the semiconductor thermocouple pair is disposed on the cold-end substrate 611 by using a first conductive electrode 615, and the other end of the semiconductor thermocouple pair is disposed on the hot-end substrate 612 by using a second conductive electrode 616. In addition, the cold-end substrate 611 abuts against the contact plate, and the hot-end substrate 612 is away from the contact plate.

During working, the contact plate 101 can be refrigerated when currents are applied to the first conductive electrode and the second conductive electrode. In addition, the refrigeration unit 61 provided in this embodiment of this application performs thermoelectric refrigeration, and the contact plate is refrigerated by using the refrigeration unit performing thermoelectric refrigeration. The refrigeration unit has a simple structure and relatively low power consumption, and is pollution-free and capable of continuously working. The refrigeration unit can reach a maximum temperature difference several seconds after a current is applied. In addition, when the refrigeration unit works, no vibration occurs, and no noise is generated. Therefore, performance of the wireless charger is improved, and user experience is enhanced.

Embodiment 2: Referring to FIG. 1a, the auxiliary heat dissipation structure includes a second fan 62. The second fan generates a flowing airflow around the second fan to dissipate heat on the contact plate 101.

Embodiment 3: The auxiliary heat dissipation structure includes a heat dissipation fin, and the heat dissipation fin is close to the contact plate 101. In other words, heat on the contact plate 101 is dissipated by using the heat dissipation fin.

In the wireless charging module provided in this embodiment of this application, as shown in FIG. 1a, the wireless charging module 2 includes a support pad 203 and an electromagnetic plate 202 and a charging coil 201 that are disposed above the support pad 203, and the charging coil 201 is close to the contact plate 101.

To further improve a heat dissipation effect on the wireless charging module, a thermally conductive block 7 is further disposed on a side that is of the wireless charging module 2 and that is away from the contact plate 101. Specifically, the support pad 203 is disposed on the thermally conductive block 7, so that a part of heat emitted by the wireless charging module is dissipated by using the thermally conductive block 7.

In the descriptions of this specification, the described specific features, structures, materials, or characteristics may be combined in a proper manner in any one or more of embodiments or examples.

The foregoing descriptions are merely specific implementations of this application, but are not intended to limit the protection scope of the utility model. Any variation or replacement readily figured out by a person skilled in the art within the technical scope disclosed in the utility model shall fall within the protection scope of the utility model. Therefore, the protection scope of the utility model shall be subject to the protection scope of the claims.

The invention claimed is:

1. A wireless charger operable to charge a terminal device that comprises a display surface and a rear surface that are opposite to each other, wherein the wireless charger comprises:
    a housing comprising a contact plate for contact with the rear surface of the terminal device;
    a wireless charging module;
    a first fan, capable of dissipating heat of the wireless charging module, wherein both the wireless charging module and the first fan are disposed in the housing, and an air intake vent is disposed at a position that is of the housing and that is close to the first fan; and
    an airflow guide structure disposed on a side that is of the housing and that is adjacent to the contact plate, wherein the airflow guide structure extends toward the display surface of the terminal device, the airflow guide structure comprises a flow channel, a first air exhaust vent connected to the flow channel is disposed at a position that is of the airflow guide structure and that is close to the display surface of the terminal device, an air vent that is connected to space in which the first fan is located is disposed at a position that is of the housing and at which the airflow guide structure is disposed, and the air vent is connected to the flow channel,
    wherein the contact plate comprises a metal part and a plastic part, and the wireless charging module is disposed at a position that is in the housing and that is opposite to the plastic part.

2. The wireless charger according to claim 1, wherein an air duct is on a side that is of the contact plate and that faces the rear surface of the terminal device, the air duct extends to an edge of the contact plate, a second air exhaust vent connected to the flow channel is disposed at a position that is of the airflow guide structure and that is close to the rear surface of the terminal device, and the second air exhaust vent is connected to the air duct.

3. The wireless charger according to claim 1, wherein a plurality of protrusions arranged in parallel are present on a side of the metal part facing the rear surface of the terminal device, an air duct is present between two adjacent ones of the protrusions, a spacing is present between a side of the plastic part that faces the terminal device and the rear surface of the terminal device, to form the air duct, and the air duct on the metal part is connected to the air duct on the plastic part.

4. The wireless charger according to claim 1, wherein the wireless charger further comprises:
    an auxiliary heat dissipation structure disposed at a position that is in the housing and that is close to the contact plate.

5. The wireless charger according to claim 4, wherein the auxiliary heat dissipation structure comprises a refrigeration unit, the refrigeration unit comprises a cold-end substrate and a hot-end substrate that are disposed opposite to each other, a plurality of semiconductor thermocouple pairs arranged in parallel are present between the cold-end substrate and the hot-end substrate, and both ends of the semiconductor thermocouple pair are disposed on the cold-end substrate and hot-end substrate by conductive electrodes, and the cold-end substrate abuts against the contact plate, and the hot-end substrate is away from the contact plate.

6. The wireless charger according to claim 4, wherein the auxiliary heat dissipation structure comprises a second fan.

7. The wireless charger according to claim 1, wherein the housing comprises a base and an installation part connected to an end of the base, the installation part is tilted relative to the base to form a vertical structure, the wireless charging module is located in the installation part, the contact plate is formed on the installation part and is located on a side away from the base, the air vent is disposed at a position that is of the installation part and that is connected to the base, and the airflow guide structure and the base are disposed opposite to each other on both sides of the installation part.

8. The wireless charger according to claim 7, wherein airflow guide structures are disposed on both opposite sides of the installation part.

9. The wireless charger according to claim 7, wherein the first fan is disposed in the base.

10. The wireless charger according to claim 1, wherein the housing has a flat plate structure, the wireless charging module and the first fan are vertically stacked in a thickness direction of the housing, the wireless charging module is close to the contact plate, the air intake vent is disposed on a first side of the housing, the air vent is disposed on a second side of the housing, and the first side and the second side are opposite to each other.

* * * * *

UNITED STATES PATENT AND TRADEMARK OFFICE
CERTIFICATE OF CORRECTION

| | | |
|---|---|---|
| PATENT NO. | : 12,046,912 B2 | |
| APPLICATION NO. | : 17/947688 | |
| DATED | : July 23, 2024 | |
| INVENTOR(S) | : Hao Wu et al. | |

It is certified that error appears in the above-identified patent and that said Letters Patent is hereby corrected as shown below:

On the Title Page

In Column 1 item (73) (Assignee), In Line 2, Delete "Ltd." And insert -- Ltd., Shenzhen (CN) --.

Signed and Sealed this
Fifth Day of November, 2024

Katherine Kelly Vidal
*Director of the United States Patent and Trademark Office*